United States Patent [19]

Raby

[11] Patent Number: 4,650,696
[45] Date of Patent: Mar. 17, 1987

[54] PROCESS USING TUNGSTEN FOR MULTILEVEL METALLIZATION

[75] Inventor: Joseph S. Raby, W. Melbourne, Fla.

[73] Assignee: Harris Corporation, Melbourne, Fla.

[21] Appl. No.: 782,691

[22] Filed: Oct. 1, 1985

[51] Int. Cl.[4] .......................................... H01L 21/285
[52] U.S. Cl. ........................................ 427/89; 427/93; 427/99; 427/91
[58] Field of Search ......................... 427/91, 89, 93, 99

[56] References Cited

U.S. PATENT DOCUMENTS

| | | |
|---|---|---|
| 3,477,872 | 11/1969 | Amick . |
| 3,669,724 | 6/1972 | Brand . |
| 3,785,862 | 1/1974 | Grill ...................... 427/91 |
| 3,881,242 | 5/1975 | Nuttall ................... 427/91 |
| 4,152,823 | 5/1979 | Hall ....................... 29/589 |
| 4,349,408 | 9/1982 | Tarng ..................... 427/91 |
| 4,356,622 | 11/1982 | Widmann . |
| 4,392,299 | 7/1983 | Shaw . |
| 4,404,235 | 9/1983 | Tarng ..................... 427/89 |
| 4,425,700 | 1/1984 | Sasaki et al. . |
| 4,441,247 | 4/1984 | Gargini ................... 427/89 |
| 4,517,225 | 5/1985 | Broadbent ............... 427/91 |
| 4,584,207 | 4/1986 | Wilson .................... 427/99 |

FOREIGN PATENT DOCUMENTS 0077535  4/1983  European Pat. Off. ............. 427/91

OTHER PUBLICATIONS

Morosanu et al, "Thin Film Preparation by Plasma and Low Pressure CVD in a Horizontal Reactor", Vacuum, vol. 31, No. 7, pp. 309 to 313 (1981).

Primary Examiner—John D. Smith
Attorney, Agent, or Firm—Barnes & Thornburg

[57] ABSTRACT

A process is provided for making semiconductor devices with refractory metal metallization layers in place of aluminum metallization layers. An insulative layer is deposited onto a silicon substrate and a pattern is formed in the insulative layer. Prior to deposition of the metallization layer onto the patterned insulative layer, a layer of polycrystalline silicon is deposited onto the patterned insulative layer by means of a low pressure chemical vapor deposition process. The polycrystalline silicon is deposited to a thickness of preferably 700–800 Angstroms. After deposition of the polycrystalline silicon layer, refractory metal is deposited by means of a low pressure chemical vapor deposition process. Preferably, the refractory metal is deposited to a thickness of one micrometer at a temperature of 300°–600° C. depending on the desired deposition rate. The refractory metal vapor deposition process etches away 300–400 Angstroms of the polysilicon layer, thereby leaving 300–400 Angstroms of polysilicon for the purpose of adhering the insulative layer to the refractory metal layer. The composite is then heat treated to reduce the vertical resistivity due to the pressure of the high resistance polycrystalline silicon layer.

23 Claims, 1 Drawing Figure

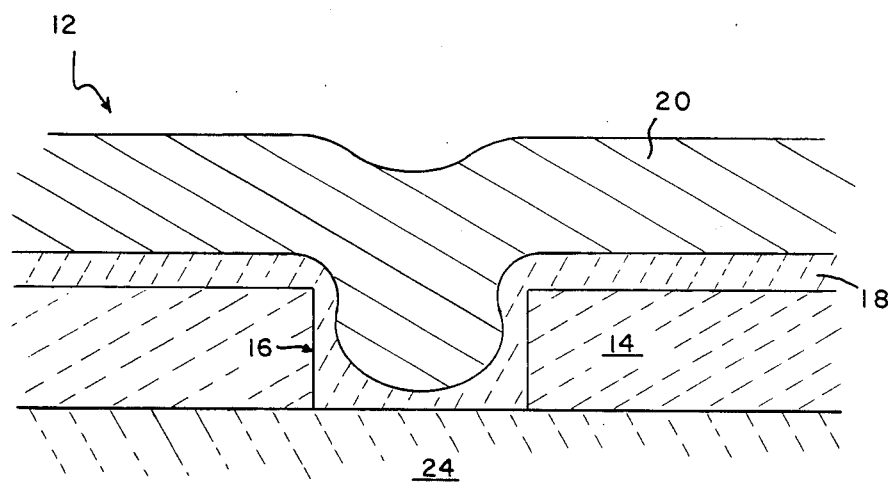

PROCESS USING TUNGSTEN FOR MULTILEVEL METALLIZATION

BACKGROUND AND SUMMARY OF THE INVENTION

This invention relates generally to a process for manufacturing a semiconductor device, and more particularly to a process for manufacturing a semiconductor device having a substrate layer, an insulative layer and metallization layer.

The prior art metal of choice for the metallization layer in a semiconductor device is aluminum. Aluminum metallization is used because it adheres well to both silicon and silicon dixode, has a high conductivity and low resistance, and can be easily vacuum deposited due to its low boiling point. Although aluminum does display certain beneficial characteristics for semiconductor applications, it also presents a number of well-known problems.

One problem accompanying the use of aluminum as a metallization layer is that aluminum step coverage is unacceptable. Aluminum sputtering is a commonly used metnod for manufacturing integrated circuits because sputtered aluminum displays superior adhesion to an underlying insulative layer. A problem arises in that sputtered metal layers are significantly affected by the profile of a surface upon which the metal is sputtered. An underlying surface exhibiting steps, as is frequently the case in semiconductor manufacture, cannot be completely covered in the region of the steps by a sputtering process. The resulting surface topography will exhibit discontinuities in the metallization layer which can have adverse affects on the operation of the semiconductor device.

Another problem accompanying tne use of aluminum as a metallization layer is the restricted temperature range within which aluminum containing devices may be subsequently treated. For example, aluminum does not perform as well as other metal contact layers at high temperatures. Therefore, temperatures at which subsequent insulating layers may be deposited on an aluminum metallization layer are severely restricted.

Other problems encountered with aluminum metallization layers include the migration of aluminum under the silicon oxide adjacent aperatures in the insulative layer which may cause shorting with layers underlying the insulative layer. Also, aluminum must frequently be treated to reduce the potential for electromigration effects caused by transport of aluminum metal within a semiconductor device when current is applied to the device.

In order to overcome tne problems associated with aluminum metallization layers, it has been suggested that chemically vapor deposited refractory metals such as tungsten be substituted for aluminum. The chemical vapor deposition process allows for significantly improved step coverage and the temperature constraints associated with tungsten are much less severe than those associated with aluminum. For example, the upper temperature limit for a tungsten metallization process is in the vicinity of 700° C. as opposed to 450° C. for aluminum. Also, contact resistance for tungsten to silicon is always equal to or less than $10^{-7}$ Ohm-cm$^2$ while aluminum exhibits a contact resistance of $10^{-5}$ Ohm-cm$^2$.

A problem arises in that chemically vapor deposited tungsten does not adhere to an insulative layer surface as well as sputtered aluminum. This problem of adhesion has been addressed in U.S. Pat. No. 3,881,242 to Nuttall et al. wherein a layer of polycrystalline silicon (poly) is deposited onto a silicon dioxide layer for the purpose of promoting adhesion between the silicon dioxide layer and a subsequently deposited metallization layer. Allegedly, the layer of poly forms a bond to both the silicon dioxide layer and the metal layer.

Nuttall discloses the use of an adhesive polycrystalline layer having a thickness in the range of 200 Angstroms to 500 Angstroms. After depositing the polycrystalline layer, the device is subjected to an atmospnere of silane and tungsten hexaflouride. Under such conditions, the deposited film is not pure tungsten, but rather a tungsten silicon compound. The resistivity of such a tungsten silicon compound, i.e., $WSi_x$ in combination with a layer of poly would be too high to be a suitable substitute for aluminum. It is probable that at the 700° C. to 750° C. deposition temperature employed for both the poly and tungsten layers, Nuttall actually converts the $WSi_x$/poly/Si layer structure to $WSi_x$ which would have a low contact resistance, but would also likely consume the silicon substrate to an extent which is unacceptable for manufacturing shallow junction devices in current demand.

Accordingly, an object of the present invention is the provision of a process yielding a semiconductor device having metallization layers which exhibit excellent conformal step coverage.

Another object of the present invention is the provision of a process yielding a semiconductor device containing metallization layers which are securely bonded to underlying insulative layers.

A further object of the present invention is the provision of a process yielding a semiconductor device exhibiting a low resistivity.

An even further object of the present invention is the provision of a process yielding a semiconductor device having shallow junctions without consuming a substrate layer and thereby jeopardizing the quality of the device.

These and other objects of the present invention are attained in the provision of a semiconductor device having refractory metal metallization layers in place of aluminum metallization layers. An insulative layer is deposited onto a silicon substrate and a pattern is formed in the insulative layer. Prior to deposition of the metallization layer onto the patterned insulative layer, a layer of polycrystalline silicon is deposited onto the patterned insulative layer by means of a low pressure chemical vapor deposition process. The polycrystalline silicon is deposited to a thickness of preferably 700-800 Angstroms. After deposition of the polycrystalline silicon layer, refractory metal is deposited by means of a low pressure chemical vapor deposition process. Preferably, the refractory metal is deposited to a thickness of one micrometer at a temperature of 300°-600° C. depending on the desired deposition rate. The refractory metal vapor deposition process etches away 300-400 Angstroms of the polysilicon layer, thereby leaving 300-400 Angstroms of polysilicon for the purpose of adhering to both the insulative layer and the refractory metal layer. The composite structure is subjected to a temperature of about 650° C. for approximately an hour. This heat treatment causes the refractory metal to diffuse along polycrystalline grain boundaries and permits dopant from adjacent substrate to enter the poly layer, thereby lowering the vertical resistance of the semiconductor device.

Significantly improved conformal step coverage relative to aluminum is achieved by the low pressure chemical vapor deposition of refractory metal while the superior adhesive characteric of sputtered aluminum is maintained due to the presence of the appropriate thickness of the adhesive polycrystalline silicon layer.

Other objects, advantages and novel features of the present invention will become apparent from the following detailed description of the invention when considered in conjunction with the accompanying drawings.

BRIEF DESCRIPTION OF THE DRAWING

The drawing shows a semiconductor device manufactured in accordance with a preferred embodiment of the present invention.

DETAILED DESCRIPTION OF THE DRAWING

Referring now to the drawing, there is shown a semiconductor device 12 having a conformal layer of refractory metal deposited thereon in accordance with the present invention. Beginning with a semiconductor substrate layer 24 comprising a monocrystalline silicon semiconductor body, an insulative layer 14 is deposited onto the body and the desired pattern 16 is etched into the insulative layer. The insulative layer may comprise any of the prior art insulative materials such as silicon dioxide or silicon nitride. After patterning of the insulative layer, a conformal layer of polycrystalline silicon (poly) 18 is deposited by means of a standard low pressure chemical vapor deposition (LPCVD) process. The low pressure process offers several advantages over conventional chemical vapor deposition processes, such as significantly improved uniformity of the deposited poly layer in the stepped patterned region 16. The polycrystalline silicon layer can be vapor deposited for example in a conventional manner, such as by deposition from a silane gas atmosphere.

The deposition of polycrystalline silicon is continued until the poly layer achieves the thickness of between 500 and 1000 Angstroms and preferably between 700 and 800 Angstroms. As discussed below, this range of polycrystalline silicon layer thickness is required to assure that an adequate amount of poly will be left after chemical vapor deposition of the refractory metal layer which will etch away approximately 300 to 400 Angstroms of the poly layer. Applying greater thicknesses of poly will adversely affect the resistivity of the resulting device. Preferably, the poly layer is deposited at a temperature of about 640° C. and at a pressure of 0.250 torr.

After deposition of the poly layer, tne refractory metal metallization layer 20 is deposited onto the poly layer 18. Preferably, a one micrometer thick layer of refractory metal is deposited by means of a chemical vapor deposition process. The chemical vapor deposition process employed may be any of the prior art processes such as that disclosed in U.S. Pat. No. 3,785,862 to Grill. Exemplary refractory metals for purposes of the present invention include tungsten and molybdenum. For example, refractory metal preferably may be vapor deposited from a refractory metal hexaflouride gas atmosphere at a temperature of about 300°–700° C. and at a pressure of 0.200 to 0.5 torr. In order to deposit a pure refractory metal layer, the metal hexafluoride gas is deposited in a hydrogen atmosphere instead of the prior art silane atmosphere. An accompanying disadvantage is that a surface reaction occurs with the exposed poly at the beginning of the deposition process, thereby consuming about 300 to 400 angstroms of the poly layer. This consumption of poly is related to the metal deposition temperature. The loss is minimized by starting the refractory metal deposition at below 500° C., preferably about 300° C., and ramping up to about 500° to 600° C. as the deposition process progresses. This should be followed by ramping down to about 300° C. at the end of the deposition process to prevent oxidation of the refractory metal surface when the device is removed from the process reactor.

Due to the very high resistivity of polycrystalline silicon, the above-described semiconductor device having a conformal metallization layer of refractory metal is advantageously heat treated at a temperature of about 650° to 700° C. for one hour in an inert atmosphere. This heat treatment promotes lower vertical resistance by causing refractory metal to diffuse along polycrystalline silicon grain boundaries and doping the polycrystalline silicon with the dopants present in the silicon contact areas. Preferably, the heat treatment temperature does not exceed 700° C. due to the risk of formation of refractory metal silicide which consumes the poly layer and the silicon substrate and results in a reduction in adhesion as discussed above in relation to the prior art process.

Tne one micron thick refractory metal layer of the resulting semiconductor device is conventionally patterned and etched such as by dry etching with $SF_6$ and freon. The poly and tungsten deposition steps are repeated for additional metallization layers. The surface of the semiconductor device becomes more planar as additional levels are added.

Tne above described process employing refractory metal metallization layers eliminates the need for reflow processes and planarization techniques required when aluminum is used as a metallization layer. Tne resulting semiconductor device exhibits superior conformal step coverage and contains metallization layers which are securely bonded to underlying insulative layers. Due to the low resistivity of refractory metal and the heat treatment of the refractory metal-polycrystalline silicon laminate, the overall resistivity of the device is minimized.

Although the invention has been described and illustrated in detail, it is to be clearly understood that the above is to be taken by way of illustration and example only and not by way of limitation. The spirit and scope of the invention are to be limited only by the terms of the appended claims.

What is claimed is:

1. A process for adhering a metallization layer to a patterned insulative layer in a semiconductor device comprising:

vapor depositing a 500 Angstrom to 1000 Angstrom thick layer of polycrystalline silicon onto said insulative layer, vapor depositing a pure refractory metal layer onto said polycrystalline silicon layer from an atmosphere conducive to depositing said refractory metal layer as a pure layer and at a deposition temperature conducive to maintenance of at least a portion of said polycrystalline silicon layer sufficient to cause said refractory metal layer to adhere to said insulative layer.

2. A process according to claim 1, wherein said refractory metal layer is initially deposited at a deposition temperature of less than about 500° C. and wherein initially said deposition temperature is thereafter increased to between 500° and 600° C.

3. A process according to claim 2, wherein said deposition temperature is initially about 300° C.

4. A process according to claim 3, wherein said polycrystalline silicon layer is deposited at a deposition temperature of about 640° C.

5. A process according to claim 3, wherein said semiconductor device is heat treated at a temperature of between about 650° C. and 700° C. after deposition of said refractory metal layer.

6. A process for adhering a metallization layer to an insulative layer in a semiconductor device comprising:
   vapor depositing polycrystalline silicon onto said insulative surface to form a polysilicon adhesive layer,
   vapor depositing a refractory metal layer onto said polysilicon adhesive layer, thereby forming a laminate, and
   heat treating said laminate to cause said refractory metal to migrate along polycrystalline silicon grain boundaries, said migration causing a reduction in vertical resistance of said semiconductor device and without forming substantial metal silicide.

7. A process according to claim 6, wherein said polysilicon layer is deposited to a thickness of between 500 and 1000 Angstroms.

8. A process according to claim 7, wherein said polycrystalline silicon layer is deposited to a thickness of between 700 and 800 Angstroms.

9. A process according to claim 6, wherein said refractory metal is selected from the group consisting of tungsten and molybdenum.

10. A process according to claim 9, wherein said refractory metal is tungsten.

11. A process according to claim 10, wherein said refractory metal layer is deposited to a thickness of 1 micron.

12. A process according to claim 6, wherein said polycrystalline silicon and metallization layers are heat treated at a temperature of less than about 700° C.

13. A process according to claim 12, wherein said polycrystalline silicon and metallization layers are heated at a temperature of about 650° C. to 700° C.

14. A process according to claim 13, wherein said heat treatment is applied for about one hour.

15. A process according to claim 6. wherein an additional layer of polycrystalline silicon is deposited onto said metal layer after said heat treating.

16. A process according to claim 6, wherein said insulative layer comprises a material selected from the group consisting of silicon dioxide and silicon nitride.

17. A process according to claim 6, wherein said polycrystalline and refractory metal layers are vapor deposited by a low pressure chemical vapor deposition process.

18. A process to claim 10, wherein said polycrystalline and refractory metal layers are vapor deposited by a low pressure chemical vapor deposition process.

19. A process for adhering a metallization layer to a patterned insulative layer in a semiconductor device comprising:
   vapor depositing a 500 Angstrom to 1000 Angstrom thick layer of polycrystalline silicon onto said insulative layer, and
   vapor depositing a layer of pure refractory metal onto said polycrystalline silicon layer, said pure refractory metal being vapored deposited from an atomsphere containing hydrogen gas and a hexaflouride compound of said refractory metal and at a deposition temperature conducive to maintenance of at least a portion of said polycrystalline silicon layer sufficient to cause said refractory metal layer to adhere to said insulative layer.

20. A process according to claim 19, wherein said laminate is heat-treated to cause said refractory metal to migrate along polycrystalline and silicon grain boundaries, said migration causing a reduction in vertical resistance of said semicondutor device.

21. A process according to claim 20, wherein said vapor depositing of said polycrystalline silicon layer and said refractory metal layer and said heat treating are conducted at temperatures of less than 700° C.

22. A process according to claim 19, wherein said refractory metal is initially deposited at a deposition temperature of about 300° C., said deposition temperature being gradually increased to about 600° C., said heat treating minimizing depletion of silicon from said polycrystalline silicon layer.

23. A process according to claim 22, wherein said deposition temperature is reduced to about 300° C. after said heat treating at about 600° C. and prior to exposure of said semiconductor device to an oxidizing atmosphere, thereby preventing oxidation of said refractory metal layer.

* * * * *